United States Patent
Araki et al.

(10) Patent No.: US 7,637,156 B2
(45) Date of Patent: Dec. 29, 2009

(54) ANGULAR VELOCITY SENSOR WITH VIBRATOR HAVING RING PORTION AND ELECTRODES POSITIONED INSIDE AND OUTSIDE THE RING PORTION

(75) Inventors: Ryuta Araki, Amagasaki (JP); Osamu Torayashiki, Amagasaki (JP); Toru Kitamura, Amagasaki (JP); Hiroshi Kawasaki, Amagasaki (JP); Tsuyoshi Takemoto, Amagasaki (JP); Koji Nakamura, Amagasaki (JP); Christopher P. Fell, Plymouth (GB); Kevin Townsend, Plymouth (GB); Ian Sturland, Filton (GB)

(73) Assignees: Sumitomo Precision Products, Hyogo (JP); Atlantic Inertial Systems Limited, Plymouth (GB)

( * ) Notice: Subject to any disclaimer, the term of this patent is extended or adjusted under 35 U.S.C. 154(b) by 464 days.

(21) Appl. No.: 11/571,974

(22) PCT Filed: Jul. 12, 2005

(86) PCT No.: PCT/JP2005/012845

§ 371 (c)(1),
(2), (4) Date: Jan. 11, 2007

(87) PCT Pub. No.: WO2006/006597

PCT Pub. Date: Jan. 19, 2006

(65) Prior Publication Data
US 2007/0220972 A1    Sep. 27, 2007

(30) Foreign Application Priority Data
Jul. 12, 2004    (JP)    ............... 2004-204965

(51) Int. Cl.
*G01P 9/04*    (2006.01)

(52) U.S. Cl. ............................... 73/504.13; 73/504.12
(58) Field of Classification Search .............. 73/504.13, 73/504.12, 504.04, 504.02, 504.15
See application file for complete search history.

(56) References Cited

U.S. PATENT DOCUMENTS 5,587,529 A * 12/1996 Iguchi et al. .............. 73/504.13

(Continued)

FOREIGN PATENT DOCUMENTS

JP    08-236704 A    9/1996

(Continued)

OTHER PUBLICATIONS

C. Fell, et al., A Second Generation Silicon Ring Gyroscope, Symposium Gyro Technology, 1999.

(Continued)

*Primary Examiner*—Helen C. Kwok
(74) *Attorney, Agent, or Firm*—Darby & Darby P.C.

(57) ABSTRACT

A vibrator 10, which is formed in a silicon wafer 1 by means of MEMS technique, has eight beam portions (beams) 12 supported at a central portion 11 and extending in the radial direction while mutually keeping the same angle and has a ring portion 13 connected to the eight beam portions 12. Outside the ring portion 13, eight electrodes 21a to 21h for electrostatic actuation, capacitance detection, or the like are spaced uniformly with a gap 22 created between the ring portion 13 and the electrodes 21a to 21h. Inside the ring portion 13, sixteen electrodes 23 for frequency adjustment are spaced uniformly with a gap 24 created between the ring portion 13 and the electrodes 23.

24 Claims, 10 Drawing Sheets

U.S. PATENT DOCUMENTS 5,616,864 A    4/1997   Johnson et al.
5,817,940 A *  10/1998  Kobayashi et al. ....... 73/504.12

FOREIGN PATENT DOCUMENTS

| JP | 10-206455 A | 8/1998 |
| JP | 11-083498 A | 3/1999 |
| JP | 11-094871 A | 4/1999 |
| JP | 11-264729 A | 9/1999 |
| JP | 11-320873 A | 11/1999 |
| JP | 2000-097710 A | 4/2000 |
| JP | 2000-111347 A | 4/2000 |
| WO | WO-03/025502 A1 | 3/2003 |
| WO | WO-03/078302 A2 | 9/2003 |

OTHER PUBLICATIONS

B.J. Gallacher, et al., Electrostatic Tuning of a Micro-Ring Gyroscope.

* cited by examiner

F I G. 4
(a)
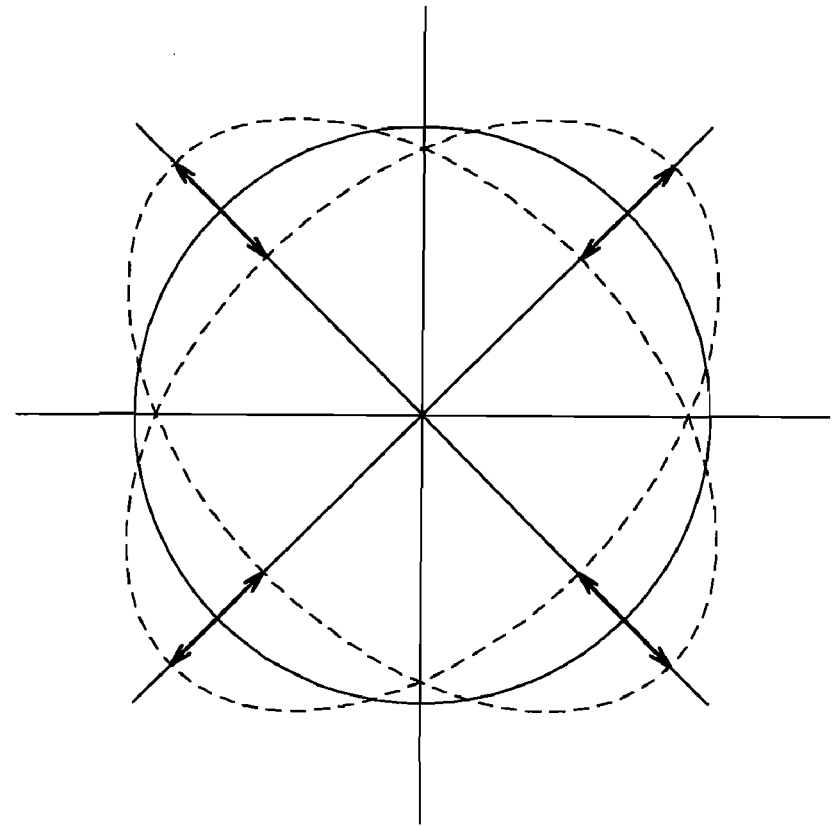
(b)
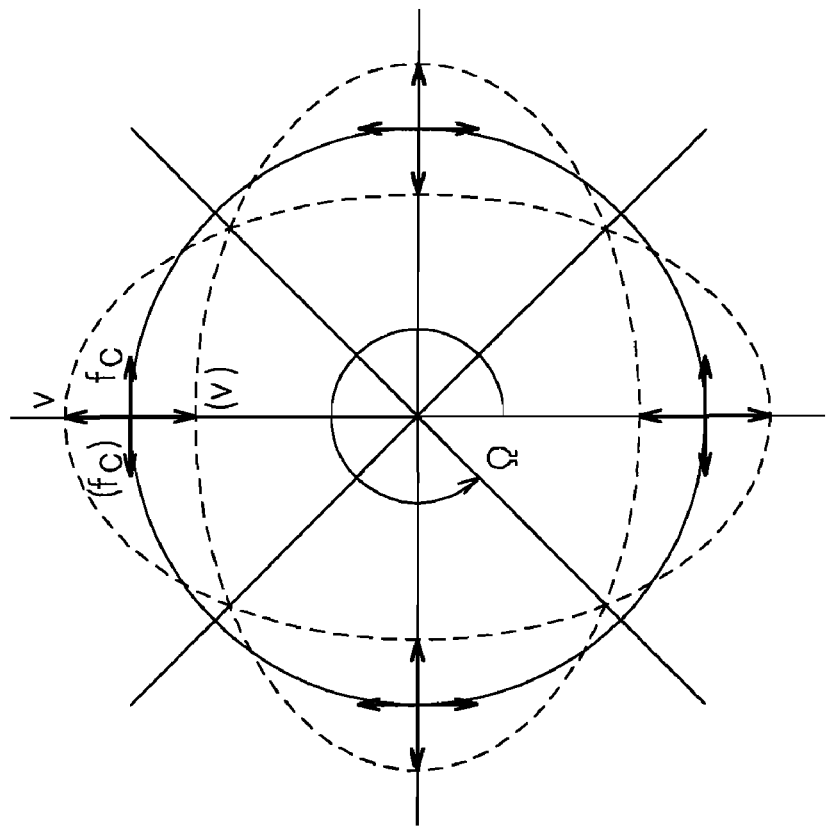

F I G. 5
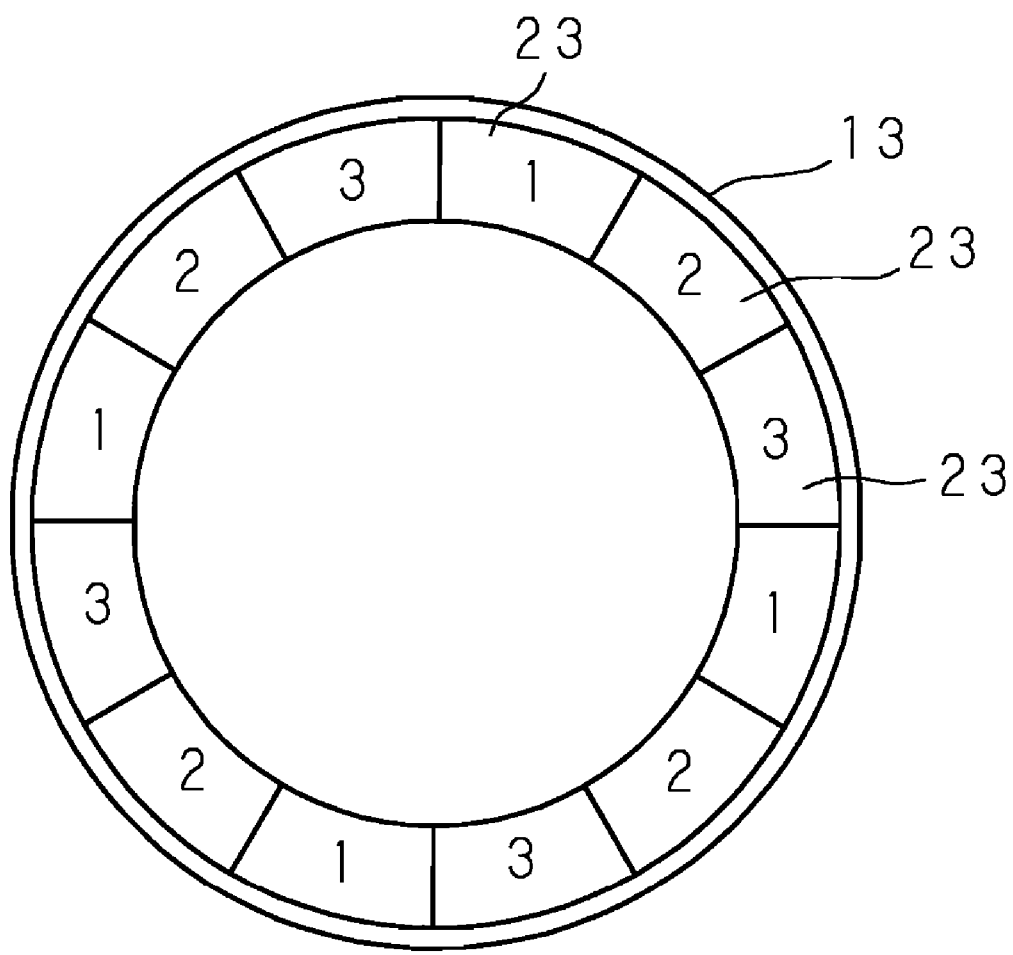

F I G. 6
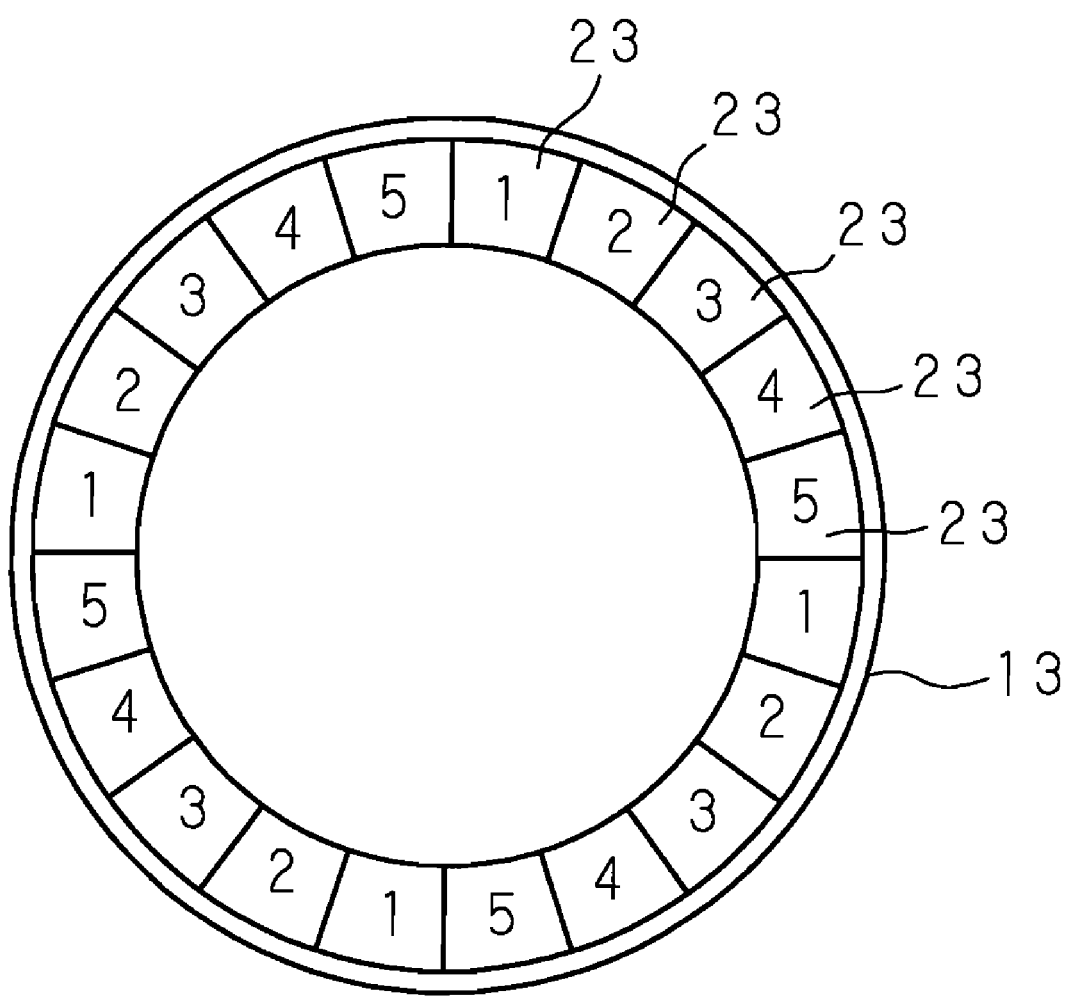

US 7,637,156 B2

ANGULAR VELOCITY SENSOR WITH VIBRATOR HAVING RING PORTION AND ELECTRODES POSITIONED INSIDE AND OUTSIDE THE RING PORTION

CROSS-REFERENCE TO PRIOR APPLICATIONS

This is a U.S. national phase application under 35 U.S.C. §371 of International Patent Application No. PCT/JP2005/012845, filed Jul. 12, 2005, and claims the benefit of Japanese Application No. 2004-204965, filed Jul. 12, 2004, both of which are incorporated by reference herein. The International Application was published in Japanese on Jan. 19, 2006 as International Publication No. WO 2006/006597 A1 under PCT Article 21(2).

TECHNICAL FIELD

The present invention relates to an angular velocity sensor which is used for shake-prevented cameras, car navigation systems, and so on and which detects the angular velocity of an object.

BACKGROUND ART

As an angular velocity sensor aimed at reducing its cost and size, an angular velocity sensor has been developed in recent years which has a structure in which a vibrator is formed in a silicon wafer by using a MEMS (micro electro mechanical system) technique which implements miniaturization of various machine elements through the application of techniques used in semiconductor manufacturing processes etc. and in which the silicon wafer is sandwiched between two glass substrates to seal the vibrator (see, for example, Japanese Patent Application Laid-Open No. 11-264729).

FIG. 10 is a block diagram of a conventional angular velocity sensor disclosed in Japanese Patent Application Laid-Open No. 11-264729. The angular velocity sensor 60 comprises a pair of glass substrates 61 and 62 and a silicon frame 70 which is formed between both glass substrates 61 and 62 and in which a vibrator 74 including a weight 71, a base 73, and T-shaped support beams 72 is formed, and therefore the angular velocity sensor 60 has a three-layer structure of the glass-the silicon-the glass. In the upper glass substrate 61, contact holes 63 are formed and in the silicon frame 70, pillars 64 are formed so as to seal the vibrator 74 with the pillars 64 fitted to the contact holes 63. A metal is sputtered in the contact holes 63, and then the metal is subjected to wire bonding, thereby electrical connections with electrodes provided on the glass substrate 61 are established.

On the bottom surface of the glass substrate 61, a comb teeth-shaped electrode 61a for electrostatic actuation extending radially, a pair of electrodes 61b for capacitance detection, and two pairs of electrodes 61c for vibration posture control provided on both sides of the electrodes 61b for capacitance detection are provided. On the top surface of the lower glass substrate 62, a comb teeth-shaped electrode 62a for electrostatic actuation which is opposite the electrode 61a for electrostatic actuation and a pair of electrodes 62b for capacitance detection which are opposite the electrodes 61b for capacitance detection and the electrodes 61c for vibration posture control are provided. In regions corresponding to the electrodes 61a and 62a for electrostatic actuation in the top and bottom surfaces of the annular weight 71 of the vibrator 74, grooves 76 are formed radially and on the bumps and in the dips of the grooves 76, electrodes are formed. Both ends of the support beams 72 are connected to the weight 71, and the support beams 72 supports the weight 71 in a hollow portion.

When driving voltage has been applied between the electrodes of the weight 71 of the vibrator 74 and the electrodes 61a and 62a for electrostatic actuation, electrostatic forces act on the electrodes 61a and 62a for electrostatic actuation in the direction of a spacing between both electrodes, thereby the vibrator 74 vibrates while rotating about the z axis. When an angular velocity has been applied about the x axis at that time, the vibrator 74 vibrates while rotating about the y axis by the action of a Coriolis force. These vibrations vary the distances between the surface of the weight 71 of the vibrator 74 and the electrodes 61b and 62b for capacitance detection, and hence capacitances between them vary. Therefore, by detecting such variations in the capacitances, the applied angular velocity can be detected.

DISCLOSURE OF THE INVENTION

In the angular velocity sensor described in Japanese Patent Application Laid-Open No. 11-264729, since the electrodes are provided on the glass substrate and wirings are provided from the electrodes to the through holes for drawing the wirings, the metal wirings pass through the sealed portion, and therefore there is a problem that the sealing property of the vibrator is low in reliability. Moreover, although a capacitance gap is determined by the etching depth of the silicon unit and the thickness of the electrodes on the glass substrate, it is difficult to reduce unevenness in etching depth as compared with the reduction of unevenness in etching width. This is because although correct etching width can be easily secured by using a mask pattern, it is difficult to control etching depth because etching depth is controlled by changing etching time and etching time is considerably affected by etching conditions. Therefore there is a problem that angular velocity sensors with uniform characteristics cannot be mass-produced.

Furthermore, in U.S. Pat. No. 5,616,864, an angular velocity sensor is disclosed which has a plane ring structure in which electrodes for electrostatic actuation and electrodes for capacitance detection are formed outside a ring portion supported by a central portion as a resonator. In such an angular velocity sensor with the plane ring structure, an angular velocity is detected through the use of vibration in a cos nθ mode (n: the order of the mode). In vibration-type angular velocity sensors (gyro) using a cos nθ mode, as primary vibration activated and secondary vibration excited by a Coriolis force generated by an angular velocity become close in natural frequency, detection accuracy heightens. However, since both natural frequencies do not agree with each other due to the dimensional deviation of a ring portion and so on, there is a need to correctly perform the matching between the resonance frequencies generated in the two vibrational modes. Therefore, in U.S. Pat. No. 5,616,864, resonance frequencies generated in two vibrational modes are differentially adjusted by applying a fixed direct-current offset voltage between the ring portion and the electrodes for electrostatic actuation through the use of the electrodes for electrostatic actuation.

In such a configuration, there is a problem that since the electrodes for electrostatic actuation are also used as electrodes for vibrational frequency adjustment, a control circuit becomes complicated. And further, although it is easy to apply the direct-current offset voltage to the electrodes for electrostatic actuation, it is difficult to apply the direct-current offset voltage to the electrodes for capacitance detection in terms of its circuit configuration, the electrodes for capacitance detection cannot be used for the adjustment of the vibrational frequencies. Because of this, the number of the electrodes which can be used for the adjustment of the vibrational frequencies is reduced and the use of the electrodes is limited only at limited angular positions. As a result, the total area of the electrodes is also reduced, and hence there is a problem that the function of performing the matching between the mode frequencies is limited.

The present invention has been accomplished in view of such circumstances, and therefore an object of the invention is to provide an angular velocity sensor in which a sealing property for vibrator can be improved and with which products with uniform characteristics can be easily mass-produced.

Another object of the invention is to provide an angular velocity sensor in which a circuit configuration is not complicated and the adjustment of a mode frequency can be made with high precision.

The angular velocity sensor according to the invention is an angular velocity sensor which includes a semiconductor substrate where a vibrator having a ring portion whose vibrational state changes in response to an angular velocity to be detected is formed. The sensor is characterized in that electrodes for electrostatic actuation for the vibrator and electrodes for capacitance detection for the vibrator are formed inside or outside the ring portion of the semiconductor substrate and electrodes for vibrational frequency adjustment of the vibrator are formed at the outside or inside of the ring portion which is opposite the side of the electrodes for electrostatic actuation and the electrodes for capacitance detection.

The angular velocity sensor according to the invention is an angular velocity sensor which includes a semiconductor substrate where a vibrator having a ring portion whose vibrational state changes in response to an angular velocity to be detected is formed. The sensor is characterized in that electrodes for electrostatic actuation of the vibrator and electrodes for capacitance detection of the vibrator are formed outside the ring portion of the semiconductor substrate and electrodes for vibrational frequency adjustment of the vibrator are formed inside the ring portion of the semiconductor substrate.

The angular velocity sensor according to the invention is an angular velocity sensor which includes a semiconductor substrate where a vibrator having a ring portion whose vibrational state changes in response to an angular velocity to be detected is formed. The sensor is characterized in that electrodes for electrostatic actuation of the vibrator and electrodes for capacitance detection of the vibrator are formed inside the ring portion of the semiconductor substrate and electrodes for vibrational frequency adjustment of the vibrator are formed outside the ring portion of the semiconductor substrate.

The angular velocity sensor according to the invention is characterized in that the vibrator, the semiconductor substrate, the electrodes for electrostatic actuation, the electrodes for capacitance detection, and the electrodes for vibrational frequency adjustment are made of the same material.

The angular velocity sensor according to the invention is characterized in that the same material is silicon.

The angular velocity sensor according to the invention is characterized in that the electrodes for electrostatic actuation, the electrodes for capacitance detection, the electrodes for vibrational frequency adjustment, and the semiconductor substrate are substantially in the same plane.

The angular velocity sensor according to the invention is characterized in that the difference in dispositional angle $\Delta\phi$ between the adjacent electrodes for vibrational frequency adjustment satisfies the expression $\Delta\phi<90°/n$ (n: the mode order of the vibrational mode of the vibrator).

The angular velocity sensor according to the invention is characterized in that the number of the electrodes for vibrational frequency adjustment is $3\times2n$, $4\times2n$, or $5\times2n$ (n: the order of the vibrational mode of the vibrator).

The angular velocity sensor according to the invention is characterized in that plural sets of electrodes for vibrational frequency adjustment each consisting of the three, four, or five electrodes are formed inside or outside the ring portion with each set disposed within each angle of $360°/2n$ (n: the order of the vibrational mode of the vibrator).

The angular velocity sensor according to the invention is characterized in that the electrodes for vibrational frequency adjustment corresponding to each other are present among the plural sets and the same voltage is applied to the corresponding electrodes for vibrational frequency adjustment of the individual sets.

The angular velocity sensor according to the invention is characterized in that the electrodes for vibrational frequency adjustment corresponding to each other are present among the plural sets and voltages are separately applied to the corresponding electrodes for vibrational frequency adjustment of the individual sets.

The angular velocity sensor according to the invention is characterized in that the vibrator has plural beam portions whose one end is supported at the central portion of the semiconductor substrate and whose the other end is connected to the ring portion.

The angular velocity sensor according to the invention is characterized in that the vibrator has plural beam portions whose one end is supported at the outside of the ring portion of the semiconductor substrate and whose the other end is connected to the ring portion.

The angular velocity sensor according to the invention is characterized in that portions equal in potential to the ring portion are formed between the electrodes for vibrational frequency adjustment and the beam portions.

The angular velocity sensor according to the invention is characterized in that protrusions are formed on the portions equal in potential to the ring portion.

The angular velocity sensor according to the invention is characterized in that amplifier circuits, which amplify detection signals from the electrodes for capacitance detection, are formed on the semiconductor substrate.

The angular velocity sensor according to the invention is characterized in that the semiconductor substrate is sandwiched between two supporting substrates and a cavity is formed in which the vibrator, the electrodes for electrostatic actuation, the electrodes for capacitance detection, and the electrodes for vibrational frequency adjustment are provided.

The angular velocity sensor according to the invention is characterized in that at least one of the electrodes for electrostatic actuation, the electrodes for capacitance detection, the electrodes for vibrational frequency adjustment, and the central portion which supports the vibrator are joined to one of the two supporting substrates.

The angular velocity sensor according to the invention is characterized in that a getter is provided in the cavity and an atmosphere in the cavity has a pressure below 100 mTorr.

The angular velocity sensor according to the invention is characterized in that the cavity is filled with an inert gas or a gas which is not adsorbed by the getter.

The angular velocity sensor according to the invention is characterized in that first wirings to be connected to the electrodes for electrostatic actuation and second wirings close to the first wirings are provided on one of the two supporting substrates and two voltages having opposite phases are applied to the first wirings and the second wirings respectively.

The angular velocity sensor according to the invention is characterized in that wiring patterns for use in applying voltages to the electrodes for vibrational frequency adjustment are formed on one of the two supporting substrates.

The angular velocity sensor according to the invention is characterized in that the number of the wiring patterns is the number of the electrodes for vibrational frequency adjustment/2n (n: the order of the vibrational mode of the vibrator) and to each wiring pattern, the electrodes for vibrational frequency adjustment spaced every 360°/2n angle are connected.

The angular velocity sensor according to the invention is characterized in that the ratio of the thickness of the semiconductor substrate to a distance between the ring portion and the electrodes for electrostatic actuation and for capacitance detection is set at 8 or higher.

In the angular velocity sensor according to the invention, since the electrodes for electrostatic actuation and the electrodes for capacitance detection are formed within the semiconductor substrate, a sealing property for the vibrator improves as compared with that of the angular velocity sensor described in Japanese Patent Application Laid-Open No. 11-264729. And further, although a capacitance gap is determined by a gap between the vibrator and the electrodes for electrostatic actuation and for capacitance detection, the gap depends on an etching width whose accurate control can be easily performed because the vibrator and these electrodes are formed in the same plane of the semiconductor substrate, and hence the angular velocity sensor having uniform characteristics can be easily mass-produced.

In the angular velocity sensor according to the invention, the electrodes for electrostatic actuation, the electrodes for capacitance detection, and the electrodes for vibrational frequency adjustment are separately formed inside or outside the ring portion of the semiconductor substrate. For example, a configuration is used in which the electrodes for electrostatic actuation and the electrodes for capacitance detection are formed outside the ring portion of the semiconductor substrate and the electrodes for vibrational frequency adjustment are formed inside the ring portion. In contrast to this, a configuration is also used in which the electrodes for electrostatic actuation and the electrodes for capacitance detection are formed inside the ring portion of the semiconductor substrate and the electrodes for vibrational frequency adjustment are formed outside the ring portion. Therefore, unlike the configuration described in U.S. Pat. No. 5,616,864, since the electrodes for electrostatic actuation are not used for the adjustment of the vibrational frequency, a control circuit is simplified in configuration. And further, since the electrodes for vibrational frequency adjustment can be spaced uniformly along the ring portion, the matching between the frequencies can be performed with high precision.

In the angular velocity sensor according to the invention, the vibrator, the semiconductor substrate, the electrodes for electrostatic actuation, the electrodes for capacitance detection, and the electrodes for vibrational frequency adjustment are substantially in the same plane and are made of the same material such as silicon. On account of this, a processing technique based on the MEMS can be easily applied thereto.

When the electrodes for vibrational frequency adjustment are disposed along the ring portion, it is required that a dispositional angle $\Delta\phi$ between the adjacent electrodes satisfy a condition $\Delta\phi < 90°/n$ (n: mode order). By satisfying the requirement that angular separation between the electrodes for vibrational frequency adjustment becomes smaller than mode angle separation in level, vibrational frequencies can be adjusted with reliability. Incidentally, the number of the electrodes for vibrational frequency adjustment may be any one of 3×2n, 4×2n, and 5×2n (n: mode order).

In the angular velocity sensor according to the invention, the individual sets each consisting of the three, four, or five electrodes for vibrational frequency adjustment are formed inside or outside the ring portion with each set disposed within each angle of 360°/2n (n: mode order). In the vibrational mode of the order n, symmetry is displayed at each angle of 360°/2n. Because of this, such a disposition of the electrodes makes the total area of the electrodes increase, and hence a region for the frequency adjustment broadens. When such a disposition of the electrodes is used, the same voltage can be applied to the corresponding electrodes between the individual sets of the electrodes, that is, the electrodes spaced by an angle of 360°/2n, or different voltages can be applied to the corresponding individual electrodes. In the former case, the arrangement of the wiring patterns can be simplified and the number of voltage sources can be reduced, while in the latter case, the frequency adjustment can be performed with high precision.

In commonly used square vibrators, they are often fixed by beams extending from the periphery. In that case, sensors fabricated by using different types of materials of glass-silicon-glass are strongly affected by internal stress caused by a difference between their expansion coefficients at the time of a change in temperature, thereby their temperature characteristics may deteriorate. In contrast to this, in the angular velocity sensor according to the invention, since the vibrator, which has the ring portion connected to the plural beam portions supported at the central portion of the semiconductor substrate, is used, a variation in internal stress acting on the vibrator is small even when temperature changes, and therefore the vibrator is not affected by the change in temperature.

In the angular velocity sensor according to the invention, portions (plates) equal in potential to the ring portion are provided between the electrodes for vibrational frequency adjustment and the beam portions. This prevents electrostatic attraction from occurring between the electrodes for vibrational frequency adjustment and the beam portions. In addition, on the portions (plates) equal in potential to the ring portion, protrusions are formed. When the position of the vibrator has changed due to an external impact, the vibrator first collides with the plates without coming into contact with the electrodes for electrostatic actuation and the electrodes for capacitance detection by virtue of the provision of the protrusions.

In the angular velocity sensor according to the invention, amplifier circuits, which amplify detection signals from the electrodes for capacitance detection, are formed on the semiconductor substrate, thereby the circuit of the sensor comes down in size and the input of disturbance components (noise) other than detection signals is reduced.

In the angular velocity sensor according to the invention, since the semiconductor substrate is sandwiched between the two supporting substrates made of glass or silicon and the electrodes for electrostatic actuation, the electrodes for capacitance detection and/or the electrodes for vibrational frequency adjustment are joined only to the upper supporting substrate, that is, fixed to the upper supporting substrate with the electrodes suspended therefrom, a large cavity can be formed in the lower supporting substrate and the area of a getter provided in the cavity can be increased.

In the angular velocity sensor according to the invention, in order to set a Q value at a predetermined value or higher, the atmosphere of the vibrator is maintained at low pressure by providing the getter in the lower supporting substrate. On the other hand, since there is a need to maintain the atmosphere of the vibrator at a predetermined pressure such that the temperature coefficient of the Q value does not become high, the cavity is filled with the inert gas or the gas which is not adsorbed by the getter.

In the angular velocity sensor according to the invention, the first wirings to be connected to the electrodes for electrostatic actuation and the second wirings close to the first wirings are provided on the upper supporting substrate and voltage opposite in phase to voltage applied to the first wirings is applied to the second wirings. When the first wirings for electrostatic actuation are present over the electrodes for capacitance detection, crosstalk occurs. Because of this, by applying the opposite-phase voltage to the second wirings provided near the first wirings, the crosstalk components are canceled out. Therefore the electrodes for capacitance detection are not affected by the crosstalk.

In the angular velocity sensor according to the invention, the wiring patterns are formed on the upper supporting substrate in the number of the number of the electrodes for vibrational frequency adjustment/2n (n: mode order), and the electrodes for vibrational frequency adjustment disposed at each angle of 360°/2n are connected to each wiring pattern. Therefore the electrodes for vibrational frequency adjustment having the same function are connected to one wiring pattern together, and hence the arrangement of the wiring patterns is simplified.

In the angular velocity sensor according to the invention, the ratio (aspect ratio) of the thickness of the semiconductor substrate to the distance between the ring portion and the electrodes for electrostatic actuation/the electrodes for capacitance detection is adjusted. Specifically, by setting the ratio at 8 or higher, the Q value is easily controlled even when the atmosphere of the vibrator is held at a pressure below 100 mTorr.

According to the invention, since the electrodes for electrostatic actuation, the electrodes for capacitance detection, and the electrodes for vibrational frequency adjustment are formed within the semiconductor substrate, the sealing property for the vibrator can be improved and the control is simplified, thereby the angular velocity sensor having uniform characteristics can be easily mass-produced. And further, the vibrator has the shape of a ring and therefore, even when the sensor is fabricated by using different types of materials such as a glass-silicon-glass layer, the sensor is not affected by a change in temperature, which makes it possible to correctly detect angular velocity. For example, since the electrodes for vibrational frequency adjustment are provided inside the ring portion of the vibrator, the internal region of the ring portion can be effectively utilized; since the electrodes for electrostatic actuation and the electrodes for capacitance detection are increased in area, a sufficiently large capacitance can be obtained; and since the electrodes for vibrational frequency adjustment are increased in area, the vibrational frequency can be adjusted with high precision.

According to the invention, since the vibrator, the semiconductor substrate, the electrodes for electrostatic actuation, the electrodes for capacitance detection, and the electrodes for vibrational frequency adjustment are made of the same material (silicon), these small-sized components can be made with high precision by means of a processing technique based on the MEMS.

According to the invention, since a dispositional angle $\Delta\phi$ between the adjacent electrodes satisfies the expression $\Delta\phi<90°/n$ (n: mode order), vibrational frequency can be adjusted with reliability.

According to the invention, since the three, four, or five electrodes for vibrational frequency adjustment make a set and the sets are formed inside or outside the ring portion with each set disposed within an angle of 360°/2n (n: mode order), the total area of the electrodes for vibrational frequency adjustment can be increased, and therefore the region of the frequency adjustment can be broadened.

According to the invention, since plates equal in potential to the beam portions and the ring portion are provided between the electrodes for vibrational frequency adjustment and the beam portions, it is possible to prevent electrostatic attraction from occurring between the electrodes for vibrational frequency adjustment and the beam portions. And further, protrusions are formed on the plates equal in potential to the beam portions and the ring portion and therefore, even when the position of the vibrator has changed due to an external impact, it is possible to prevent the vibrator from coming into contact with the electrodes for electrostatic actuation and the electrodes for capacitance detection.

According to the invention, since amplifier circuits, which amplify detection signals from the electrode for capacitance detection, are formed on the semiconductor substrate, the circuit of the sensor can be made smaller in size and by reducing disturbance input included in detection signals, correct detection results can be obtained.

According to the invention, since the electrodes for electrostatic actuation, the electrode for capacitance detection and/or the electrodes for vibrational frequency adjustment are joined to the upper supporting substrate, a large cavity can be formed in the lower supporting substrate provided under these electrodes, and the area of a getter to be provided can be secured.

According to the invention, since the getter is provided in the cavity of the lower supporting substrate and the atmosphere of the vibrator is held at a low pressure (below 100 mTorr), a Q value can be set above a predetermined value. And further, since the cavity is filled with an inert gas or a gas which is not adsorbed by the getter and the ratio (aspect ratio) of the thickness of the semiconductor substrate to a distance between the ring portion and the electrodes for electrostatic actuation and for capacitance detection is set at 8 or higher, the Q value can be easily controlled to a desired value without becoming very high even when the pressure of the atmosphere of the vibrator is below 100 mTorr.

According to the invention, since second wirings, to which voltage opposite in phase to voltage applied to first wirings is applied, are provided near the first wirings for electrostatic actuation on the supporting substrate, the effect of crosstalk on the electrodes for capacitance detection can be suppressed.

According to the invention, since the electrodes for vibrational frequency adjustment spaced every 360°/2n angle are connected to individual wiring patterns formed on the upper supporting substrate in the number of the number of the electrodes for vibrational frequency adjustment/2n (n: mode order), the simplification of the wiring patterns can be implemented.

BRIEF DESCRIPTION OF THE DRAWINGS

FIGS. 4(a) and 4(b) are illustrations showing the states of primary and secondary vibrations generated at the angular velocity sensor according to the invention.

FIG. 5 is a schematic diagram of an exemplary disposition of electrodes for vibrational frequency adjustment.

FIG. 6 is a schematic diagram of another exemplary disposition of the electrodes for vibrational frequency adjustment.

EXPLANATION OF REFERENCE NUMERALS

1: SILICON WAFER (SEMICONDUCTOR SUBSTRATE)
2, 3: GLASS SUBSTRATE
10: VIBRATOR
11: CENTRAL PORTION
12: BEAM PORTION (BEAM)
13: RING PORTION
21a, 21b: ELECTRODE FOR ELECTROSTATIC ACTUATION (ACTUATING ELECTRODE)
21e, 21f: ELECTRODE FOR CAPACITANCE DETECTION (DETECTING ELECTRODE)
22, 24, 26, 28: GAP
23: ELECTRODE FOR VIBRATIONAL FREQUENCY ADJUSTMENT (ADJUSTING ELECTRODE)
25: PLATE
25a, 25b: PROTRUSION
27: PAD
29: AMPLIFIER CIRCUIT
31: THROUGH HOLE
32: PAD
33, 34: CAVITY
35: GETTER
36: WIRE
41: METAL WIRING (FIRST WIRING)
42: VOLTAGE SOURCE
43: METAL WIRING (SECOND WIRING)
51: WIRING PATTERN

BEST MODE FOR IMPLEMENTING THE INVENTION

Figure 1:
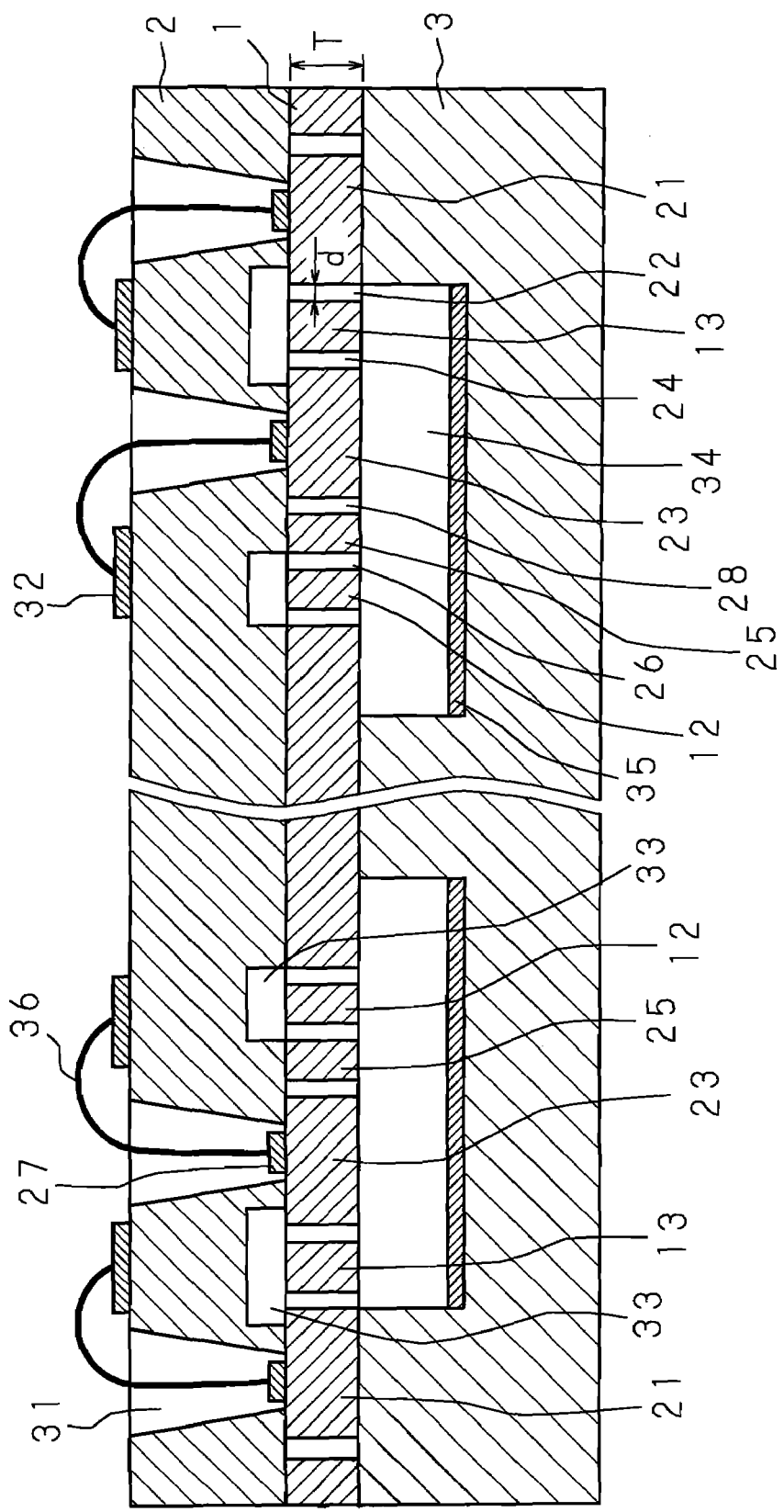
FIG. 1 is a cross-sectional view of an angular velocity sensor according to the present invention.
Figure 2:
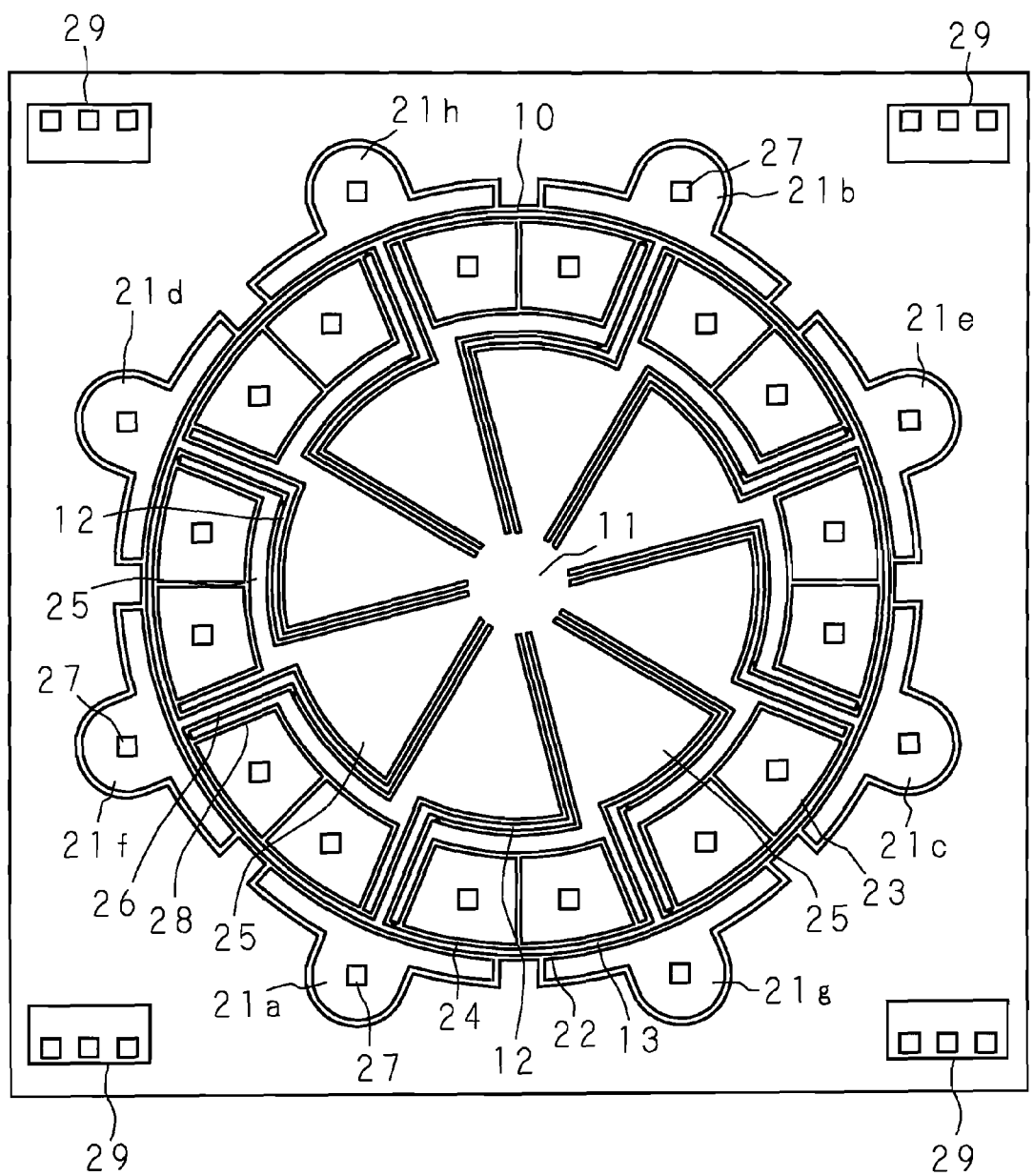
FIG. 2 is a plan view of the silicon wafer of the angular velocity sensor according to the invention.

An embodiment of the present invention will be described below in detail with reference to the drawings. FIG. 1 is a cross-sectional view of an angular velocity sensor according to the present invention, and FIG. 2 is a plan view of the silicon wafer of the angular velocity sensor according to the invention.

In angular velocity sensors having a plane ring resonator structure, assuming that the mode order of vibration is n, their operation can also be effected by using a pair of cos nθ modes based on any n. However, in high-order modes, mode coupling coefficients become lower and the forms of the modes become complicated, and therefore low-order modes (n=2 or n=3) are widely used as a matter of practicality. In the following embodiment, an example in which n=2, that is, an example in which a cos 2θ mode is used will be described.

The angular velocity sensor according to the invention has a structure in which the silicon wafer 1 (which is, for example 100 to 300 μm in thickness and which includes various electrodes and a vibrator formed by using the MEMS technique and described later) as a semiconductor substrate is sandwiched between two glass substrates 2 and 3 made by using Pyrex® glass as supporting substrates and therefore has a three-layer structure of the glass-the silicon-the glass. And further, a vibrator 10 formed in the silicon wafer 1 is sealed with the glass substrates 2 and 3 at low pressure. The vibrator 10 has eight beam portions (beams) 12 supported at a central portion 11 and extending in the direction of the radius of the vibrator 10 while mutually keeping the same angle and a ring portion 13 connected to the eight beam portions 12. One end of the beam portions 12 is supported at the central portion 11, and the other end of the beam portions 12 is connected to the ring portion 13 such that the beam portions 12 support the ring portion 13.

At the outside of the ring portion 13, eight electrodes 21 (21a to 21h) are formed with not only a suitable gap 22 (of, for example, about 10 μm) provided between the electrodes 21 and the ring portion 13 but the same spacing provided between the electrodes 21. The two electrodes 21 opposite to each other have the same function; that is, the electrodes 21a and 21b are electrodes for electrostatic actuation (hereinafter also simply referred to as actuating electrodes) which generate a primary vibration at the vibrator 10, the electrodes 21c and 21d are electrodes which detect the primary vibration generated at the vibrator 10, the electrodes 21e and 21f are electrodes for capacitance detection (hereinafter also simply referred to as detecting electrodes) which detect a secondary vibration generated at the vibrator 10, and the electrodes 21g and 21h are electrodes which cancel out the secondary vibration generated at the vibrator 10.

In order to match the frequency of the primary vibration with the natural frequency of the vibrator 10, the amplitude and frequency of the primary vibration are controlled between the actuating electrodes 21a and 21b and the electrodes 21c and 21d for the primary vibration detection. In order to eliminate the effect of a Coriolis force caused by the secondary vibration to heighten detection accuracy, voltages for use in nulling the secondary vibration are applied to the electrodes 21g and 21h. By monitoring the voltages, the magnitude of the angular velocity is detected. Since the electrodes having the same function are provided in twos as described above, the sensitivity to detect the angular velocity can be doubled. And further, when a variation in output have occurred due to the application of an external impact, the electrodes can be expected to produce their mutual effect of canceling the variation since the electrodes having the same function are provided at positions which are opposite to each other (positions which are symmetric to each other with respect to a point).

At the inside of the ring portion 13, sixteen electrodes 23 for vibrational frequency adjustment (hereinafter also simply referred to as adjusting electrodes) are formed with not only a suitable gap 24 (of, for example, about 10 μm) provided between the electrodes 23 and the ring portion 13 but the same spacing provided between the electrodes 23. These adjusting electrodes 23 are electrodes which control the natural frequency of the vibrator 10 through the use of electrostatic attraction, and to the adjusting electrodes 23, voltages are applied to perform the matching between the natural frequency generated by the primary vibration and the natural frequency generated by the secondary vibration. In this embodiment, the matching between both natural frequencies can be performed well by forming the sixteen adjusting electrodes 23.

Since the vibrator 10 (the ring portion 13 and the beam portions 12), the electrodes 21, and the adjusting electrodes 23 are formed substantially in the same plane by using the same material (silicon), the production cost of the angular velocity sensor is reduced and the MEMS technique with which small-sized structures can be produced with high precision is easy to use. Incidentally, silicon which is suitable for processing techniques based on the MEMS and has electrical conductivity is generally used as the material for the sensor; however, a metal laminated by means of sputtering or plating may be used as the material.

According to the invention, the eight electrodes 21 (21a to 21h) such as the actuating electrodes and the detecting electrodes are disposed outside the ring portion 13, and the sixteen adjusting electrodes 23 are disposed inside the ring portion 13. Therefore the eight electrodes 21 disposed outside the ring portion 13 are able to obtain sufficiently high capacitance without being affected by their reduced area associated with the disposition of the adjusting electrodes 23. That is, by using such a configuration, the areas of the eight electrodes 21 can be increased such that sufficiently high capacitance can be obtained and the areas of the sixteen adjusting electrodes 23 can be increased as compared with a configuration in which all the twenty-four electrodes are disposed outside the ring portion 13, thereby the vibrational frequency can be adjusted with high precision. In addition, since the adjusting electrodes 23 are formed by effectively using the internal region of the ring portion 13, such a small-sized structure can be implemented.

Figure 3:
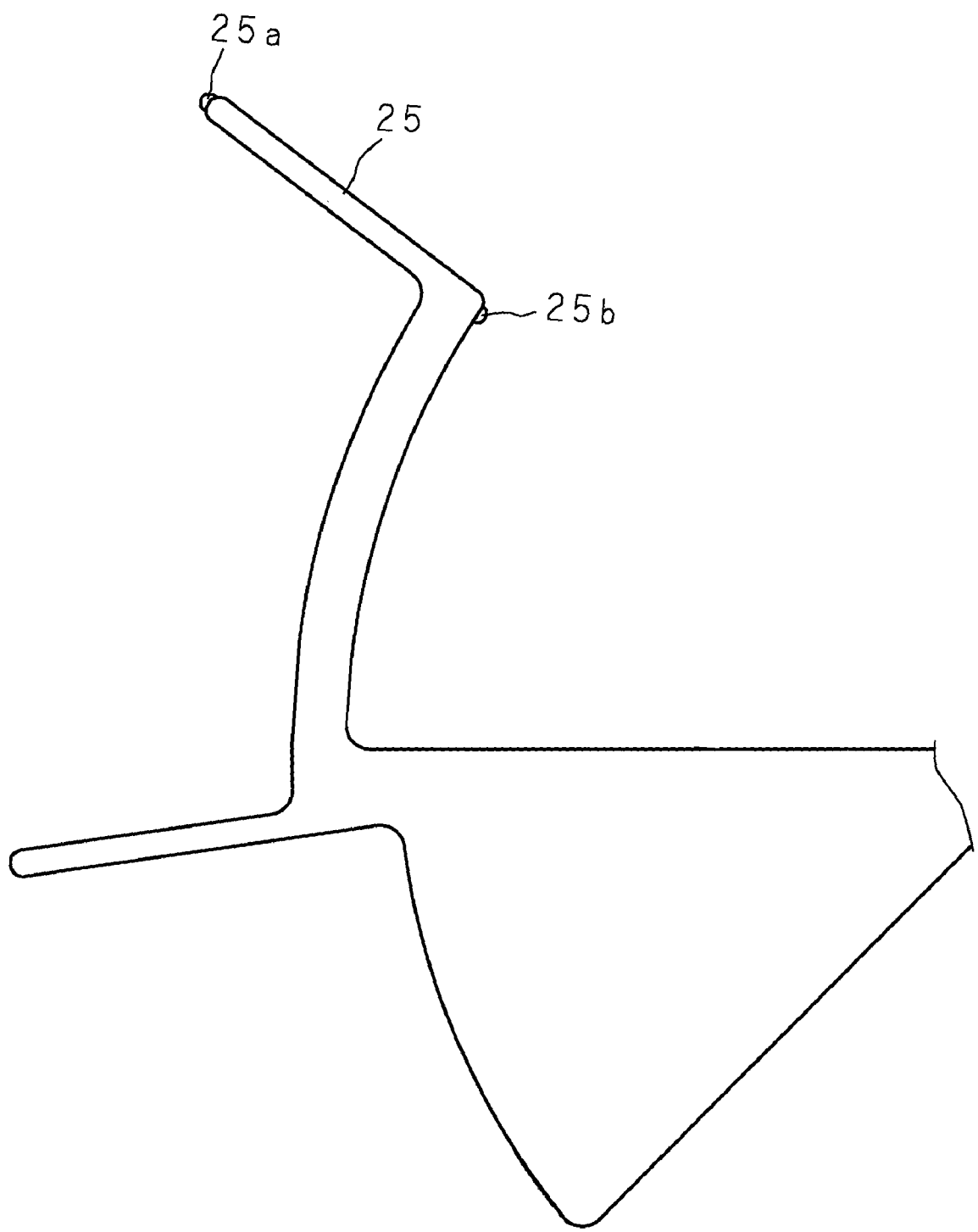
FIG. 3 is an enlarged view of a plate of the angular velocity sensor according to the invention.

Between the adjacent beam portions 12 and between the beam portions 12 and the electrodes 23, eight plates 25 having the same electric potential as that of the beam portions 12 and the ring portion 13 are formed with gaps 26 provided between the plates 25 and the beam portions 12 and gaps 28 provided between the plates 25 and the electrodes 23. FIG. 3 is an enlarged view of the plate 25. On the surface of the plate 25 which is opposite the ring portion 13, a protrusion 25a is formed, and on the surface of the plate 25 which is opposite the beam portion 12, a protrusion 25b is formed.

And further, at the corner portions of the silicon wafer 1, amplifier circuits 29 are formed which amplify detection signals from the electrodes 21c, 21d, 21e, and 21f for use in detecting primary and secondary vibrations which have occurred at the vibrator 10, and hence a configuration in which the preamplifiers are included in the sensor chip is provided.

In the upper glass substrate 2, through holes 31 are formed at places corresponding to the electrodes 21 (21a to 21h) and 23. Wires 36, which connect the pads 27 of the electrodes 21 (21a to 21h) and 23 and pads 32 formed on the surface of the glass substrate 2, are inserted through the through holes 31. Regions in the lower portion of the glass substrate 2 which are corresponding to the vibrator 10 (the beam portions 12 and the ring portion 13) are partially cut away into cavities 33. In regions other than portions where the through holes 31 and cavities 33 are formed, the bottom surface of the glass substrate 2 is joined to the silicon wafer 1.

In the top surface of the lower glass substrate 3, a large cavity 34 is provided, and on the bottom surface of the cavity 34, a getter 35 is provided. In regions other than a portion where the cavity 34 are provided, the top surface of the glass substrate 3 is joined to the silicon wafer 1. The getter 35 adsorbs hydrogen gas which generates at the time of the anode junction between the glass substrate 3 and the silicon wafer 1.

The two glass substrates 2 and 3 support the vibrator 10 and the various electrodes 21 and 23, and the vibrator 10 is sealed with the substrates 2 and 3 at low pressure. Since the adjusting electrodes 23 provided inside the ring portion 13 are joined only to the upper glass substrate 2, that is, since the adjusting electrodes 23 are fixed in the state of being suspended from the upper glass substrate 2, the large cavity 34 can be provided in the lower glass substrate 3 and a large area can be secured to provide the getter 35. According to the invention, since the actuating electrodes or the detecting electrodes are formed in the silicon wafer 1, good sealing properties can be obtained as compared with a case where these electrodes are provided on a glass substrate. The vibrator 10 (the beam portions 12 and the ring portion 13) vibrates in the cavities 33 and 34.

Next, the operation of the angular velocity sensor according to the invention will be described below. In the angular velocity sensor according to the invention, by actuating the vibrator 10 through the use of electrostatic attraction (a primary vibration), detecting a variation in a capacitance caused by an additional vibration (a secondary vibration) generated in response to the application of an angular velocity, and monitoring voltages to be applied to the electrodes 21g and 21h in order to null the secondary vibration, the applied angular velocity is detected. To begin with, voltages are applied to the actuating electrodes 21a and 21b to generate a primary vibration in cos 2θ mode at the vibrator 10. The state of the primary vibration is shown in FIG. 4(a). When an angular velocity (Ω of FIG. 4(a)) has occurred about an axis perpendicular to the ring portion 13 at this time, a Coriolis force (fc of FIG. 4(a)) is generated, thereby a secondary vibration in sin 2θ mode is generated. The state of the secondary vibration is shown in FIG. 4(b). When the configuration is perfect, the resonance frequency of the primary vibration and that of the secondary vibration agree with each other in theory.

When a direct voltage $V_{DC}$ and an alternating voltage $V_{AC}$ have been applied for the electrostatic actuation of the vibrator 10, a force F applied to the electrodes is expressed by the following expression (1):

$$F = \epsilon S (V_{DC} + V_{AC})^2 / 2d^2 \qquad (1)$$

where $\epsilon$ is a permittivity, S is the total area of the electrodes, and d is the distance between the ring portion and the electrodes.

The quantity of electricity Q accumulated between the vibrator 10 and the electrodes 21c and 21d during vibration is expressed by the following expression (2), and a current expressed by the following expression (3) is detected. As a result, by monitoring a variation in the current, a primary vibration is detected. Then a secondary vibration excited by a Coriolis force generated by the application of an angular velocity is detected by the electrodes 21e and 21f; following voltages, which are to be applied to the electrodes 21g and 21h for the purpose of nulling the excited secondary vibration, are monitored to detect the applied angular velocity.

[EXPRESSION 1]

$$Q = \frac{\varepsilon S}{d_0 + ae^{j\omega t}} V \qquad (2)$$

-continued $$I = \frac{dQ}{dt}$$ (3)

$$= -\frac{j\varepsilon SVa\omega e^{j\omega t}}{(d_0 + ae^{j\omega t})^2}$$

where V is a voltage between the ring portion and the electrodes, $d_o$ is an initial distance between the ring portion and the electrodes, a is the amplitude of the primary vibration, and ω is a resonance frequency.

Next, the structure, action, effect, and so on of the adjusting electrodes 23 which constitute the features of the invention will be described below. In the vibration-type angular velocity sensor using a cos nθ mode, there is a need to accurately match the natural frequency of a generated primary vibration to that of a secondary vibration excited by an angular velocity, and therefore the adjusting electrodes 23 perform adjustment to do the matching between these natural frequencies. When a voltage has been applied to the adjusting electrode 23, the magnitude of a variation in a frequency generated in a cos 2θ mode depends on the angular position of the adjusting electrode 23 to the axis of vibration in the mode. The cos 2θ mode includes two modes with the deviation of a vibration axis of 45°. When a voltage has been applied in the direction of the vibration axis (a side perpendicular to the radial direction) in one of the two modes, a maximum shift at the mode frequency is achieved. This position agrees with a section in the radial direction of the other mode and a movement in the radial direction does not occur at this position. As a result, the variation in the frequency becomes minimum in this mode. Therefore, in order to minimize the frequency difference between the two modes (that is, a frequency sprit of a non-zero mode) of an imperfect ring produced in its manufacturing process, the mode frequency can be differentially adjusted. The magnitude of the voltage applied to the adjusting electrode 23 is calculated so as to induce a frequency shift by which an initially measured frequency split is correctly compensated.

When the direction of the vibration axis in one of the two modes does not completely agree with one adjusting electrode 23, both the modes have the movement in the radial direction at this position. Because of this, when a voltage has been applied, both frequencies vary. In this case, to make agreement between both mode frequencies, a considerably high voltage is required, and hence the calculation of the required voltage becomes more complicated. When the required voltage can be easily calculated, it is necessary to correctly divide equilibrant to the electrodes along the vibration axis of the mode having the high frequency of the two vibrational modes in order to efficiently achieve the equilibrium of the frequencies.

Therefore, in this embodiment, the four adjusting electrodes 23 are disposed between a 0° angle and a 90° angle, a 90° angle and a 180° angle, a 180° angle and a 270° angle, and 270° angle and a 360° (=0°) angle with each adjusting electrode having an angle of 22.50. In this configuration, voltages $\Delta V_1$ and $\Delta V_2$ expressed by the following expressions (4) and (5) are applied to the adjusting electrodes 23 which are nearest both sides of the vibration axis of the mode having the high frequency to provide decomposition power along the vibration axis (with an angle of $\phi_m$).

[EXPRESSION 2]

$$\Delta V_1 = \sqrt{k \frac{\sin 2n(\phi_2 - \phi_m)}{\sin 2n(\phi_1 - \phi_2)} \cdot \Delta F}$$ (4)

$$\Delta V_2 = \sqrt{k \frac{\sin 2n(\phi_1 - \phi_m)}{\sin 2n(\phi_2 - \phi_1)} \cdot \Delta F}$$ (5)

where $\phi_1$ and $\phi_2$ are the angular positions of the two adjusting electrodes 23 which are nearest both sides of the vibration axis (with the angle of $\phi_m$), n is mode order (in this embodiment, n=2), ΔF is the split of the mode frequencies to be equilibrated with each other, and k is a constant which defines a coefficient of frequency adjustment.

Incidentally, when the vibration axis of the high-frequency mode coincides with the center of one of the adjusting electrodes 23, it is required to apply a voltage only to the adjusting electrode 23. For example, when $\phi_m=\phi_1$, $\Delta V_2=0$ and when $\phi_m=\phi_2$, $\Delta V_1=0$.

The above effect can also be obtained by disposing the four adjusting electrodes 23 only between the 0° angle and the 90° angle; in addition to this, in this embodiment, the total area of the adjusting electrodes 23 is increased by disposing the adjusting electrodes 23 to which the same voltage is applied in the other angular regions as well such that the area for the frequency adjustment can be quadrupled. This is because the shape of the vibration of the cos 2θ mode has a symmetry at each angle of 90°. In vibrational mode of the order n, the symmetry is displayed at each angle of 360°/2n in general. Because of this, by disposing electrodes for vibrational frequency adjustment at each angle of 360°/2n, areas for frequency adjustment can be broadened as in the case of the cos 2θ mode.

The conditions of the disposition of the adjusting electrodes 23 are that the equilibrant can be decomposed along the vibration axis of the high-frequency mode (the angle: $\phi_m$) in sufficient angular resolution and that the cos 2θ mode frequency can be differentially shifted. To meet these conditions, it is required that the difference in dispositional angle between the adjacent adjusting electrodes 23 be smaller than the elongation degree of the mode. Specifically, with the difference between the dispositional angles Δϕ, it is required to meet a condition expressed by the following expression (6). More specifically, the difference between the dispositional angles Δϕ is smaller than 45° in the cos 2θ mode and is smaller than 30° in the cos 3θ mode.

$$\Delta\phi < 90°/n$$ (6)

where n is the mode order.

When the difference in dispositional angle between the adjusting electrodes 23 is close to the limit of the expression (6) and the vibration axis is located between the two adjusting electrodes 23, voltages applied to the adjusting electrodes 23 exercise similar effects on both modes, and therefore there is a need to apply a high voltage for the frequency matching. However, since the individual adjusting electrodes 23 increase in size, the surface area of the sensor increases, thereby there is a possibility that such effects are partially offset.

It is preferable that the adjustment region be maximized by maximizing the total area of the adjusting electrodes 23. Moreover, it is desirable that the adjusting electrodes 23 be disposed in each arc-shaped region with an angle of 180°/n by the same number. By using such a configuration, the set number of the adjusting electrodes 23 can be increased up to 2n sets.

In this embodiment, the adjusting electrodes 23 are disposed in each arc-shaped region with an angle of 90° in a number of 4, and therefore the adjusting electrodes 23 are disposed in a total number of 16. FIGS. 5 and 6 show other examples of the disposition of the adjusting electrodes 23 in the cos 2θ mode. In the example of FIG. 5, the adjusting electrodes 23 are disposed in each arc-shaped region with an angle of 90° in a number of 3, and therefore the adjusting electrodes 23 are disposed in a total number of 12. In the example of FIG. 6, the adjusting electrodes 23 are disposed in each arc-shaped region with an angle of 90° in a number of 5, and therefore the adjusting electrodes 23 are disposed in a total number of 20.

If the adjusting electrodes 23 have been disposed in each arc-shaped region with an angle of 90° in a number of 2, the condition expressed by the expression (6) is not met, thereby the frequency matching cannot be made. On the other hand, although it is possible to make the number of the adjusting electrodes 23 to be disposed higher than that indicated in the example of FIG. 6, it cannot be said that such a configuration is practical because the number of required electrical connections increases and the areas of the electrodes to which differential voltage is to be applied decrease.

Therefore, when the order of the mode is represented by using letter n, a configuration is practical in which the total number of the adjusting electrodes 23 to be disposed is set at 3×2n, 4×2n, or 5×2n. Therefore, in the cos 3θ mode, it is preferable to take a configuration in which the adjusting electrodes 23 are provided in each arc-shaped region with an angle of 60° (in an angle of 180°/n, n=3) in a number of 3, 4, of 5, that is, the adjusting electrodes 23 are provided in a total number of 18, 24, or 30.

The further features and effect resulting from the features of the angular velocity sensor according to the invention will be described below. Since the vibrator 10 is comprised of the eight beam portions 12 supported by the central portion 11 and the ring portion 13 connected to the beam portions 12, the mass of the vibrator 10 can be reduced as compared with other vibrators, and hence the influence of an inertial force is reduced. And further, when the vibrator 10 vibrates, the location of its center of gravity does not vary, and therefore a reaction force is small, thereby an influence on the fixed system of the vibrator 10 is reduced. Since the beam portions 12 are supported by the central portion 11, the sensor is not affected by an internal stress resulting from the difference in expansion coefficient between the glasses and the silicon and therefore has excellent temperature characteristics.

Since the various electrodes are formed in the silicon wafer 1, the reliability of the sealing function of the vibrator 10 can be heightened. Moreover, since the vibrator 10 (ring portion 13) and the various electrodes are formed in the same plane, the distance between the vibrator 10 (ring portion 13) and the various electrodes is controlled by adjusting the width of a mask pattern. Such control can be easily performed, and hence a desired distance can be easily put between them. As a consequence, the angular velocity sensor having desired and uniform characteristics can be mass-produced.

The control of the Q value of the angular velocity sensor according to the invention will be described below. Generally, the Q value required for the vibrator 10 is above 1000. When the pressure of the atmosphere of the vibrator 10 is high, the Q value is low. Therefore, in order to lower the pressure, the getter 35 which adsorbs gas (hydrogen gas generated during the anode junction in particular) is provided in the glass substrate 3. However, when the Q value is too high, there are problems that it is required that the control system of a circuit for driving the vibrator 10 (a PLL (phase locked loop) circuit which controls a vibrating element for driving voltage etc. in particular) has high resolution, the temperature characteristics degrade due to a damper effect resulting from internal friction high in temperature coefficient, and so on. Because of this, the Q value has an upper limit.

Therefore, in order to obtain any Q value, it can be considered that a method is used in which the damper effect is controlled by using gas, that is, by sealing the sensor with an inert gas (Ar, Ne, or the like) which is not absorbed by the getter 35 at the time of the anode junction. However, since a high voltage is applied at the time of the anode junction, the problem of electric discharge arises when the pressure of the inert gas is in a predetermined range. For example, when Ar has been used as the sealing gas and a voltage above 350 V has been applied at the time of the anode junction, electric discharge occurs at a pressure above 100 mTorr. The Q value is affected by the pressure of the atmosphere of the vibrator 10, and therefore at a pressure below 100 mTorr, the Q value becomes very high and then exceeds the upper limit.

Even under the same pressure, the structure of the vibrator 10 has a large influence on the damping effect and in particular, the gap portion has a great influence on a squeeze damping effect.

With consideration given to such an influence, in this embodiment, the ratio of the thickness T of the silicon wafer 1 (see FIG. 1) to the distance d between the ring portion 13 and the electrodes 21 (21a to 21h), i.e., the width d of the gap 22 (see FIG. 1) (aspect ratio) T/d is heightened. Specifically, by setting the value of the aspect ratio T/d at 8 or higher, the Q value of the vibrator 10 is controlled. Therefore, according to the invention, even when the pressure is below 100 mTorr, the Q value can be controlled so as not to become very high.

Next, the effect of the plates 25 provided between the beam portions 12 and between the beam portions 12 and the adjusting electrodes 23 and the effect of the protrusions 25a formed on the plates 25 will be described below. The plates 25 and the vibrator 10 (the beam portions 12 and the ring portion 13) have the same potential. Since the plates 25 are provided between the beam portions 12 and the adjusting electrodes 23, it is possible to prevent the action of electrostatic attraction between the beam portions 12 and the adjusting electrodes 23, and hence the natural frequency of the vibrator 10 does not vary.

When an inertial force has been generated by an external impact, the beam portions 12 or the ring portion 13 collide with the plates 25 equal in potential to them through the presence of the protrusions 25a of the plates 25 first, which makes it possible to suppress the amount of displacement of the beam portions 12 or the ring portion 13. Incidentally, in a case where the protrusions 25a are formed on the beam portions 12 or the ring portion 13 as well, the same effect as that described above can be brought about; however, in such a case where the protrusions 25a are formed on the beam portions 12 or the ring portion 13 which are movable components, it can be considered that a change in the mass thereof, the abnormal occurrence of a stress, and so on adversely affect the vibration. Because of this, in the invention, the protrusions 25a are formed on the plates 25 which are fixed components.

Further, the levels of detection signals outputted from the electrodes 21c, 21d, 21e, and 21f for use in detecting the primary or secondary vibration having occurred at the vibrator 10 are considerably low, and hence the signals are affected by stray capacitance. As a consequence, false signals to be incorporated into a detection channel are produced, thereby it can be considered that the performance of the sensor deteriorates. In order to minimize an error, it is preferable to amplify detection signals near electrodes as much as possible. Therefore, in this embodiment, the amplifier circuits 29 are formed in the silicon wafer 1 to amplify detection signals from the electrodes 21c, 21d, 21e, and 21f. On account of this, even when their levels are low, correct detection signals can be obtained.

Figure 7:
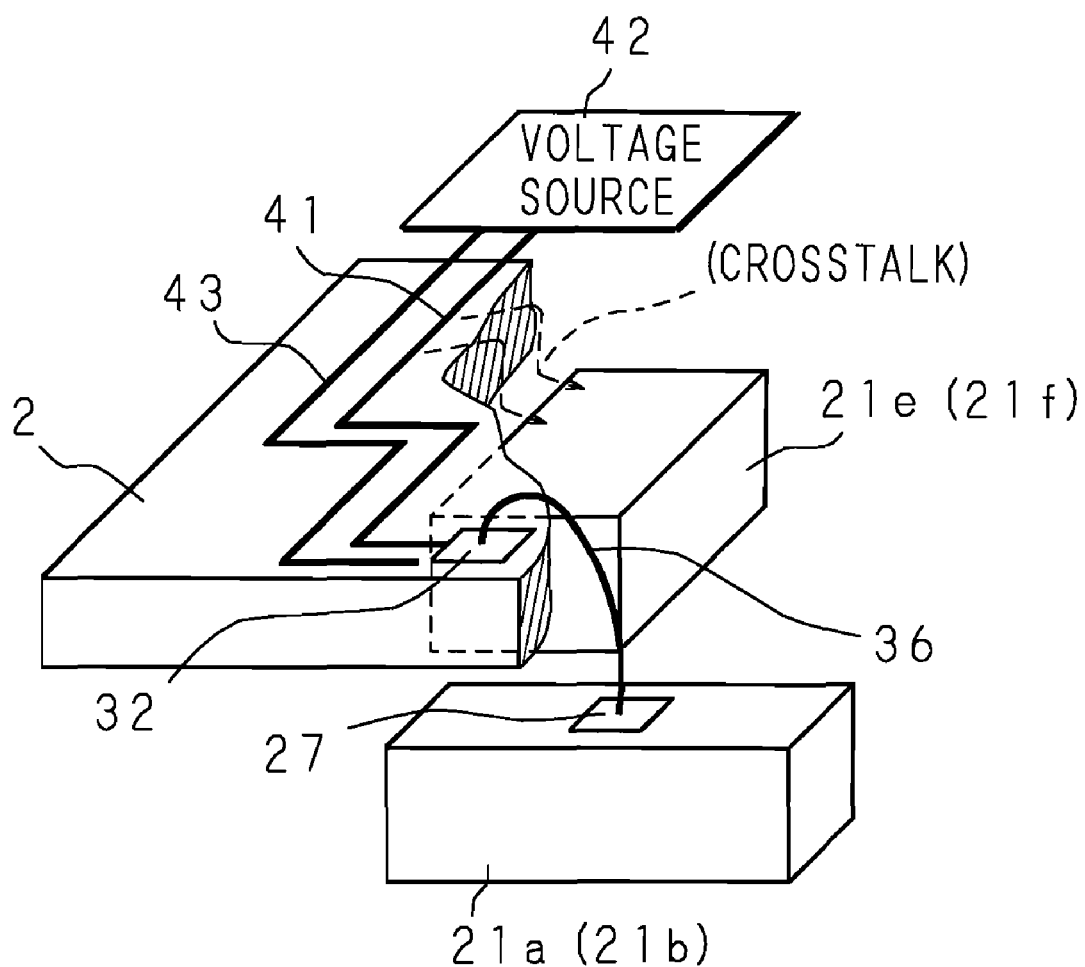
FIG. 7 is a schematic diagram of a metal wiring formed on a glass substrate and connected to an electrode for electrostatic actuation.

Next, metal wirings on the upper glass substrate 2 will be described below. FIG. 7 is a schematic diagram of the metal wiring connected to the actuating electrode 21a (or 21b). In FIG. 7, components which are the same as those shown in FIGS. 1 and 2 are represented by using the same reference numerals. The metal wiring 41 for driving voltage, whose one end is connected to the pad 32 on the glass substrate 2 connected to the pad 27 of the actuating electrode 21a via the wire 36, is formed on the glass substrate 2 by means of patterning as a first wiring. The other end of the metal wiring 41 is connected to a voltage source 42. In parallel to the metal wiring 41, the metal wiring 43 for canceling is formed on the glass substrate 2 by means of patterning as a second wiring. One end of the metal wiring 43 is opened and the other end is connected to the voltage source 42.

The voltage source 42 applies a driving voltage to the metal wiring 41 and applies a voltage opposite in phase to the driving voltage to the metal wiring 43. In a case where the metal wiring 41 for driving voltage is provided over the detecting electrode 21e (or 21f), signal propagation (crosstalk) occurs due to capacitive coupling. Hence, in this embodiment, the crosstalk component is canceled by applying a voltage opposite in phase to a driving voltage to the metal wiring 43 near the metal wiring 41. As a result, the detecting electrode 21e (or 21f) is able to receive detection signals not affected by crosstalk, which makes it possible to detect a correct angular velocity.

Since voltage for use in driving the primary vibration is generally higher than driving voltage for use in nulling the secondary vibration, the structure described above can be applied only to the metal wirings connected to the electrodes 21a and 21b for driving the primary vibration, which makes it possible to prevent the metal wirings from becoming more complicated than is necessary. However, when an angular velocity to be detected is very high, crosstalk resulting from driving voltage for use in nulling the secondary vibration significantly increases, and therefore it is preferable that such a structure be also applied to the actuating electrodes 21g and 21h for use in nulling the secondary vibration.

Figure 8:
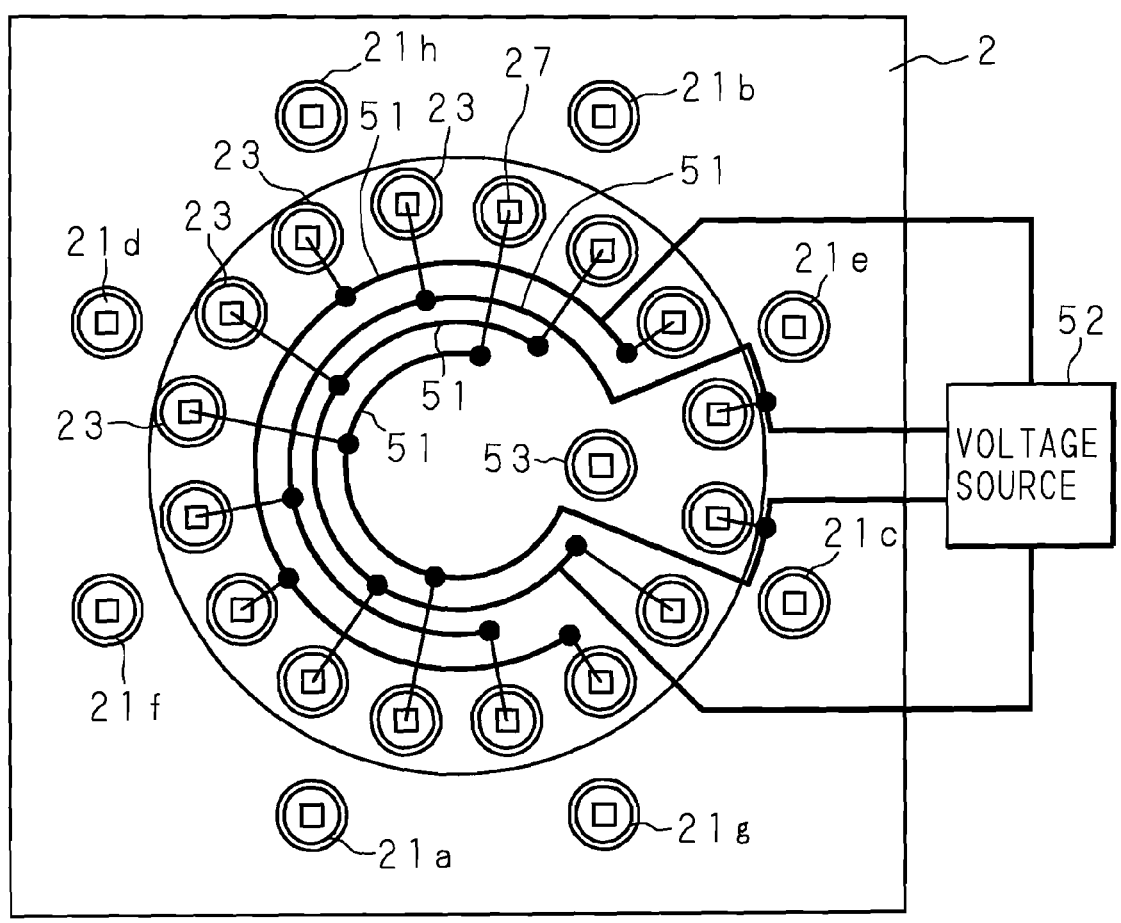
FIG. 8 is a schematic diagram of wiring patterns formed on the glass substrate and connected to the electrodes for vibrational frequency adjustment.

In the following, metal wirings for the sixteen adjusting electrodes 23 on the upper glass substrate 2 will be described. FIG. 8 is a schematic diagram of the metal wirings. In FIG. 8, components which are the same as those shown in FIGS. 1 and 2 are represented by using the same reference numerals. On the upper glass substrate 2, four wiring patterns 51 (16 (the number of the adjusting electrodes)/2×2 (the mode order)=4) are formed. The four adjusting electrodes 23 spaced every angle of 90° (360°/2×2) are connected to each wiring pattern 51 via through holes formed in the glass substrate 2 by means of wire bonding. One end of each wiring pattern 51 extends to one edge of the glass substrate 2, and the other end of each wiring pattern 51 is connected to a voltage source 52 which applies voltages to at least one of the adjusting electrodes 23.

Incidentally, reference numeral 53 denotes an electrode which feeds a steady DC voltage to the ring portion 13.

In this embodiment, since the four adjusting electrodes 23, to which the same adjusting voltage is applied, are connected to one wiring pattern 51 together, the structure of the wiring can be simplified as compared with a case where the sixteen adjusting electrodes 23 are each provided with wiring.

In the wiring pattern shown in FIG. 8, the number of the voltage sources provided for the adjusting electrodes 23 can be minimized by applying the same voltage to the four adjusting electrodes 23 spaced every 90° angle. However, in order to implement frequency adjustment with high precision when the resolution of the voltage source is insufficient, it is preferable to individually apply different voltages to the four adjusting electrodes 23 spaced every 90° angle. For example, in a case where the resolution of the voltage source has three levels, when the same voltage has been applied to the adjusting electrodes 23 spaced every 90° angle, it is possible to provide only three levels of equilibrant. In contrast, if different voltages can be individually applied, it is possible to provide twelve levels of equilibrant.

Since the electrodes for vibrational frequency adjustment are separately arranged inside the sensor, disposing the wiring patterns on the glass substrate and providing electric connection to the electrodes are useful for the facilitation of connection with the outside.

Figure 9:
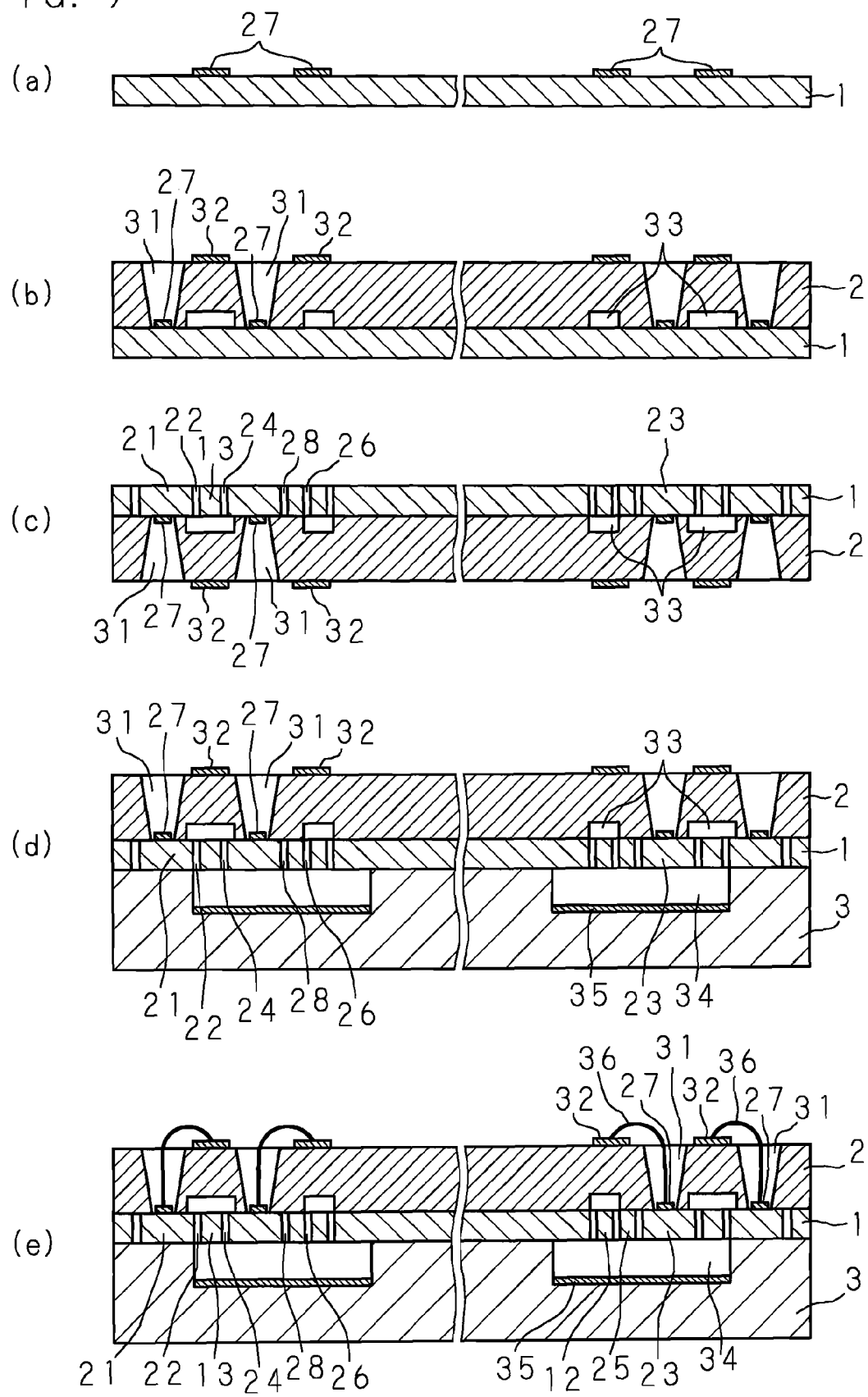
FIGS. 9(a)-9(e) are cross-sectional views of the angular velocity sensor according to the invention shown in the order of its manufacturing steps.
Figure 10:
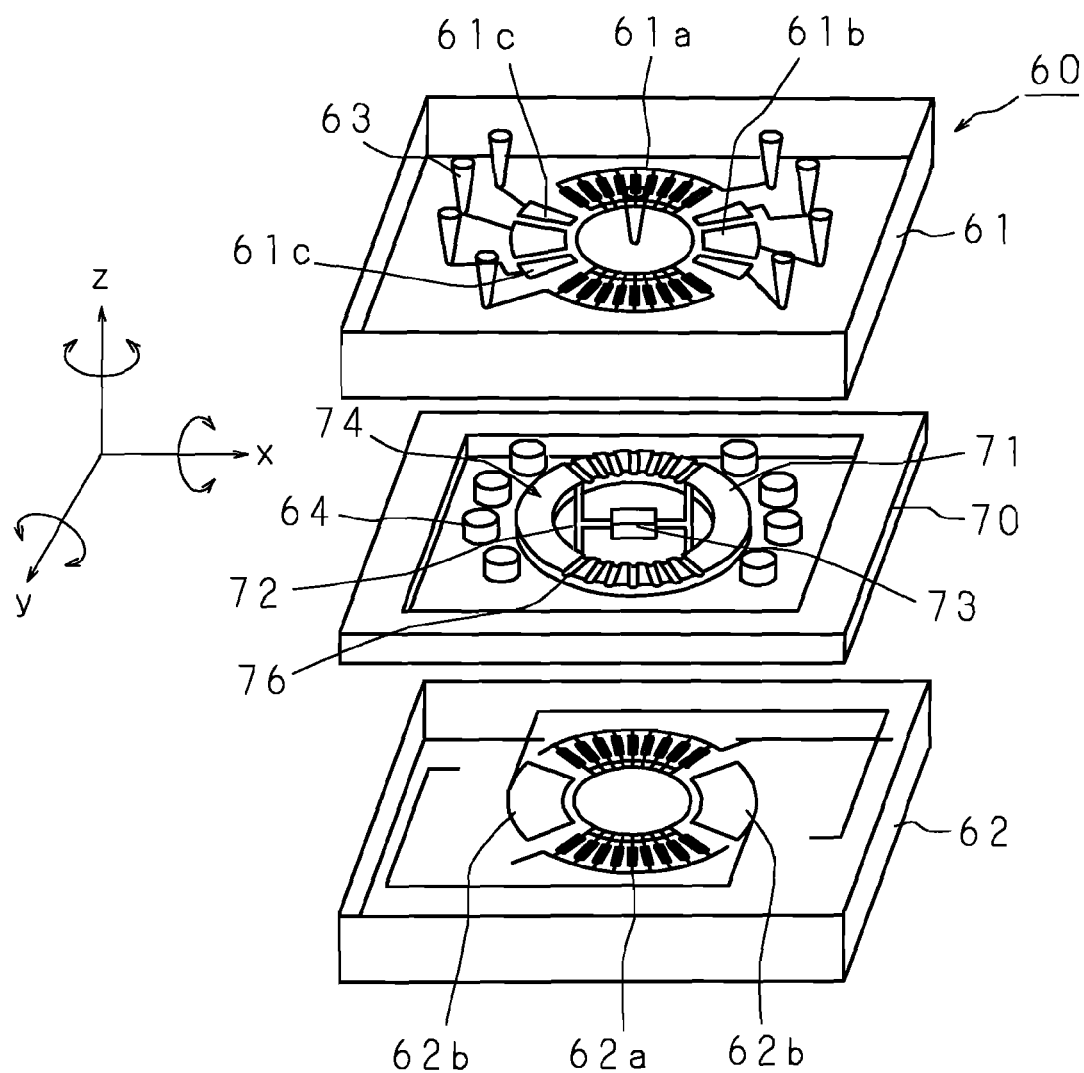
FIG. 10 is a schematic diagram of a conventional angular velocity sensor.

In the following, a method for manufacturing the angular velocity sensor according to the invention will be described. FIG. 9 is a cross-sectional view of the angular velocity sensor shown in the order of its manufacturing steps. The pads 27 are formed on the silicon wafer 1 (FIG. 9(a)). Specifically, after metal film has been evaporated onto the surface of the silicon wafer 1 for the provision of the pads 27, the pads 27 are subjected to patterning by means of wet etching in which a resist pattern formed by using photolithography is used as a mask.

Then the upper glass substrate 2 in which the through holes are made is joined to the silicon wafer 1 by means of anode junction (FIG. 9(b)). Incidentally, the cavities 33 are formed in advance in the upper glass substrate 2 to be joined thereto by means of sand blasting and the pads 32 and the metal wirings (not shown) are formed in advance on the surface of the upper glass substrate 2 through the series of processes of the metal film evaporation, photolithography, and wet etching. Thereafter, the vibrator 10 including the ring portion 13, the electrodes 21 and 23, the grooves 22 and 24, and so on are formed in the silicon wafer 1 by using the MEMS technique including Deep RIE (reactive ion etching) and so forth (FIG. 9(c)).

Then the lower glass substrate 3 is joined to the silicon wafer 1 by means of anode junction (FIG. 9(d)). Incidentally, in the lower glass substrate 3 to be joined thereto, the getter 35 is provided in advance on the bottom surface of the cavity 34 formed by means of sand blasting. The cavity 35 is filled with an argon gas at the time of the junction. After the junction, the getter 35 is chemically activated through heating to make the getter 35 adsorb a hydrogen gas and so forth. Finally, the pads 27 on the electrodes 21 and 23 of the silicon wafer 1 and the pads 32 on the upper glass substrate 2 are bonded together via the wires 36 (FIG. 9(e)).

In the example described above, the glass-silicon-glass three-layer structure consisting of the upper glass substrate 2, the silicon wafer 1, and the lower glass substrate 3 are provided; while silicon substrates can also be used instead of the glass substrates. That is, the invention is also applicable to a glass-silicon-silicon three-layer structure, a silicon-silicon-glass three-layer structure, and a silicon-silicon-silicon three-layer structure. However, to provide electrical isolation between the silicon layers, there is a need to provide an insulating film such as a SiO$_2$ film between them. In addition, the junction of the silicon layers is carried out by means of fusion junction in which bonding is carried out through heating instead of anode junction.

In the embodiment described above, the case where the vibration is generated in the cos 2θ mode has been described; while the invention is also applicable to a case where vibration is generated in a cos 3θ mode. And further, the structure according to the invention can be used for all common cos nθ modes.

Furthermore, in the above embodiment, the electrodes for electrostatic actuation and the electrodes for capacitance detection are formed outside the ring portion and the electrodes for vibrational frequency adjustment are formed inside the ring portion; while the invention is also applicable to a structure in which electrodes for electrostatic actuation and electrodes for capacitance detection are formed inside a ring portion and electrodes for vibrational frequency adjustment are formed outside the ring portion. Moreover, electrodes for electrostatic actuation, electrodes for capacitance detection, and electrodes for vibrational frequency adjustment can be formed such that these electrodes are provided separately outside a ring portion or inside the ring portion.

And further, in the foregoing embodiment, the ring portion is supported by the beam portions whose one end is supported by the central portion of the silicon wafer; while the invention is also applicable to a structure in which a ring portion is externally supported.

Still further, in this embodiment, only the electrodes for vibrational frequency adjustment are joined to (suspended from) the upper glass substrate; while the electrodes for electrostatic actuation, the electrodes for capacitance detection, and/or the central portion which supports the ring portion can also be joined to (suspended from) the upper glass substrate. By forming such a structure, the cavity increases in dimension, and hence the getter increases in area, thereby a high-reliability package can be implemented.

Furthermore, in the embodiment, the plates 25 equal in potential to the ring portion 13 are provided; however, the plates 25 are not necessarily essential components. When only a weak electrostatic attraction can be exerted by adjusting the sizes of the beam portions 12 and the adjusting electrodes 23 or the distance between the beam portions 12 and the adjusting electrodes 23, there is no need to provide the plates 25.

The invention claimed is:

1. An angular velocity sensor including a semiconductor substrate where a vibrator having a ring portion whose vibrational state changes in response to an angular velocity to be detected is formed, comprising:
   electrodes for electrostatic actuation for the vibrator and electrodes for capacitance detection for the vibrator formed inside or outside the ring portion of the semiconductor substrate; and
   electrodes for vibrational frequency adjustment for the vibrator formed at the outside or inside of the ring portion which is opposite the side of the electrodes for electrostatic actuation and the electrodes for capacitance detection.

2. An angular velocity sensor including a semiconductor substrate where a vibrator having a ring portion whose vibrational state changes in response to an angular velocity to be detected is formed, comprising:
   electrodes for electrostatic actuation for the vibrator and electrodes for capacitance detection for the vibrator formed outside the ring portion of the semiconductor substrate; and
   electrodes for vibrational frequency adjustment for the vibrator formed inside the ring portion of the semiconductor substrate.

3. An angular velocity sensor including a semiconductor substrate where a vibrator having a ring portion whose vibrational state changes in response to an angular velocity to be detected is formed, comprising:
   electrodes for electrostatic actuation for the vibrator and electrodes for capacitance detection for the vibrator formed inside the ring portion of the semiconductor substrate; and
   electrodes for vibrational frequency adjustment for the vibrator formed outside the ring portion of the semiconductor substrate.

4. The angular velocity sensor according to claim 1, wherein the vibrator, the semiconductor substrate, the electrodes for electrostatic actuation, the electrodes for capacitance detection, and the electrodes for vibrational frequency adjustment are made of the same material.

5. The angular velocity sensor according to claim 4, wherein the same material is silicon.

6. The angular velocity sensor according to claim 1, wherein the electrodes for electrostatic actuation, the electrodes for capacitance detection, the electrodes for vibrational frequency adjustment, and the semiconductor substrate are substantially in the same plane.

7. The angular velocity sensor according to claim 1, wherein a difference in dispositional angle Δϕ between the adjacent electrodes for vibrational frequency adjustment satisfies the expression Δϕ<90°/n (n: the order of the vibrational mode of the vibrator).

8. The angular velocity sensor according to claim 1, wherein a number of the electrodes for vibrational frequency adjustment is 3×2n, 4×2n, or 5×2n (n: the order of the vibrational mode of the vibrator).

9. The angular velocity sensor according to claim 1, wherein the electrodes for vibrational frequency adjustment include plural sets of electrodes for vibrational frequency adjustment each consisting of three, four, or five electrodes that are formed inside or outside the ring portion with each set disposed within an angle of 360°/2n (n: the order of the vibrational mode of the vibrator).

10. The angular velocity sensor according to claim 9, wherein the electrodes for vibrational frequency adjustment corresponding to each other are present among the plural sets and the same voltage is applied to the corresponding electrodes for vibrational frequency adjustment of the individual sets.

11. The angular velocity sensor according to claim 9, wherein the electrodes for vibrational frequency adjustment corresponding to each other are present among the plural sets and voltages are separately applied to the corresponding electrodes for vibrational frequency adjustment of the individual sets.

12. The angular velocity sensor according to claim 1, wherein the vibrator has plural beam portions each having one end that is supported at a central portion of the semiconductor substrate and another end that is connected to the ring portion.

13. The angular velocity sensor according to claim 1, wherein the vibrator has plural beam portions each having one end that is supported at the outside of the ring portion of the semiconductor substrate and another end that is connected to the ring portion.

14. The angular velocity sensor according to claim 12, wherein portions equal in potential to the ring portion are formed between the electrodes for vibrational frequency adjustment and the beam portions.

15. The angular velocity sensor according to claim 14, wherein protrusions are formed on the portions equal in potential to the ring portion.

16. The angular velocity sensor according to claim 1, wherein amplifier circuits, which amplify detection signals from the electrodes for capacitance detection, are formed on the semiconductor substrate.

17. The angular velocity sensor according to claim 1, wherein the semiconductor substrate is sandwiched between two supporting substrates and a cavity is formed in which the vibrator, the electrodes for electrostatic actuation, the electrodes for capacitance detection, and the electrodes for vibrational frequency adjustment are provided.

18. The angular velocity sensor according to claim 17, wherein at least one of the electrodes for electrostatic actuation, the electrodes for capacitance detection, the electrodes for vibrational frequency adjustment, and a central portion which supports the vibrator are joined to one of the two supporting substrates.

19. The angular velocity sensor according to claim 17, wherein a getter is provided in the cavity and an atmosphere in the cavity is set at a pressure below 100 mTorr.

20. The angular velocity sensor according to claim 19, wherein the cavity is filled with an inert gas or a gas which is not adsorbed by the getter.

21. The angular velocity sensor according to claim 17, wherein first wirings to be connected to the electrodes for electrostatic actuation and second wirings close to the first wirings are provided on one of the two supporting substrates, and a voltage source is provided which applies different voltages having opposite phases to the first wirings and the second wirings respectively.

22. The angular velocity sensor according to claim 17, wherein wiring patterns for use in applying voltages to the electrodes for vibrational frequency adjustment are formed on one of the two supporting substrates.

23. The angular velocity sensor according to claim 22, wherein the wiring patterns include a number of the wiring patterns equal to the number of the electrodes for vibrational frequency adjustment/2n (n: the order of the vibrational mode of the vibrator) and to each wiring pattern, ones of the electrodes for vibrational frequency adjustment spaced every $360°/2n$ angle are connected.

24. The angular velocity sensor according to claim 1, wherein a ratio of the thickness of the semiconductor substrate to a distance between the ring portion and the electrodes for electrostatic actuation and for capacitance detection is set at 8 or higher.

* * * * *